United States Patent [19]
Sugawara

[11] Patent Number: 5,617,361
[45] Date of Patent: Apr. 1, 1997

[54] NON-VOLATILE SEMICONDUCTOR MEMORY DEVICE

[75] Inventor: Hiroshi Sugawara, Tokyo, Japan

[73] Assignee: NEC Corporation, Tokyo, Japan

[21] Appl. No.: 625,830

[22] Filed: Apr. 1, 1996

[30] Foreign Application Priority Data

Mar. 31, 1995  [JP]  Japan .................................... 7-75134

[51] Int. Cl.$^6$ .................................................. G11C 16/04
[52] U.S. Cl. .................... 365/189.01; 365/236; 365/233; 365/230.06
[58] Field of Search ........................ 365/189.01, 189.05, 365/236, 233, 230.06

[56] References Cited

U.S. PATENT DOCUMENTS 4,985,867  1/1991  Ishii et al. ................................ 365/221
5,361,227  11/1994  Tanaka et al. ...................... 365/189.01

OTHER PUBLICATIONS

T. Takeshima et al.; "TA 8.6: A 3.3 V Single–Power–Supply 65Mb Flash Memory with Dynamic Bit–Line Latch (DBL) Programming Scheme"; ISSCC94/Session 8, Paper TA 8.6; 1994 IEEE International Solid–State Circuits Conference; pp. 148–149.

*Primary Examiner*—Viet Q. Nguyen
*Attorney, Agent, or Firm*—Whitham, Curtis, Whitham & McGinn

[57] ABSTRACT

A non-volatile semiconductor memory (flash memory) has a row selection section for selecting a word line for a row of a memory transistor in a programming period and a column section section for selecting a plurality of bit lines in cyclic order in the programming period, so that the writing control section programs the memory transistors arranged in the row in one programming period. The length of time for programming the memory transistors in each of the columns is set precisely at a first period. The resultant threshold voltage of the memory transistors programmed in this way has a reduced variation among the memory transistors, so that a reliable programming can be effected.

3 Claims, 4 Drawing Sheets

NON-VOLATILE SEMICONDUCTOR MEMORY DEVICE

BACKGROUND OF THE INVENTION

1. Field of the Invention

The present invention relates to a non-volatile semiconductor memory device and, more particularly, to a non-volatile semiconductor memory device in which a plurality of memory cells are implemented by field effect transistors (FETs) each having a floating gate and arranged in a matrix and within which programming of the memory cell transistors is performed row by row.

2. Description of the Related Art

Non-volatile semiconductor memory devices include a flash memory having a plurality of memory cell transistors implemented by FETs each having a floating gate and arranged in a matrix, i.e., in row and column directions. Recently, the memory capacity of such a non-volatile semiconductor memory device has been increased more and more, and hence writing data therein is executed row by row to reduce the length of time required for the writing (programming). This type of the non-volatile semiconductor memory device is described in ISCC94, SESSION 8, "DRAMS AND NON-VOLATILE MEMORIES", PAPER TA 8.6 by H. Sugawara et al, for example.

FIG. 1 shows an example of such a conventional non-volatile semiconductor memory device, while FIG. 2 shows a timing chart thereof wherein waveforms for a single block in the memory cell array in FIG. 1 are shown, the memory cell array includes x blocks arranged in a row direction and each including k bit lines ($BL_1$—$BL_k$, for example).

In a programming operation, data signals $DI_1$—$DI_x$ each of a k-bit data are supplied from outside the memory device as the data to be stored, which are latched by shift registers $SR_{1a}$—$SR_{xa}$ through data-in buffer sections (blocks) $DIB_1$—$DIB_x$ in accordance with a data fetch signal DGET output from a timing control section 7a.

In response to a first level (a low level) of a write control signal PROG, a timing control section 7a starts to generate an internal clock signal ICK, and the level of a selected word line $Wi_l$ is changed to assume a selection level. An internal address generating section 9 generates an internal address signal ADI for specifying an internal address within each of the blocks in the memory cell array 1. The address indicated by the internal address signal ADI is successively updated synchronously with the internal clock signal ICK so that the specified internal address advances in a cyclic order.

A column address buffer section 4 receives the internal address signal ADI and transmits the same to a column decoder 5a. The column decoder 5a decodes the internal address signal ADI so as to successively change column selection signals $Y_1$—$Y_k$ on respective output lines thereof so that one of the k column selection signals $Y_1$—$Y_k$ assumes a selection level. A column selecting circuit 6 connects one of the bit lines $BL_1$ to $BL_k$, in response to one of the column selection signals $Y_1$—$Y_k$ having the selection level, to the output of, the corresponding write control section $WA_1$—$WA_x$.

Data signals $DI_l$ to $DI_x$ latched in shift registers $SR_{1a}$—$SR_{xa}$ are transmitted along the shift registers $SR_{1a}$—$SR_{xa}$ and through the output end of the shift register (e.g., $SR_{1a}$) to the write control section (e.g., $WA_1$) synchronously with the internal clock signal ICK. The write control section (e.g., $WA_1$) controls the potential of the corresponding block of the bit lines $BL_1$ to $BL_k$ in accordance with the level of the data signal transmitted thereto.

When one of the data signals has a high level for programming a specified memory cell transistor into a programmed state, the potential of the corresponding bit line (e.g., $BL_1$) is controlled to have a programming potential Vp. When the data signal has a low level for allowing the memory cell transistor to hold an erased state, the corresponding bit line is left at a floating state. In FIG. 2, for the sake of simplification, a specific case is shown in which each of the data signals $DI_1$—$DI_k$ has a high level for programming.

The potentials on the bit lines can be maintained by respective parasitic capacitance of the bit lines etc. for a while, and are gradually lowered due to programming current requiring electric charge. To recover the potentials, the write control sections $WA_1$ to $WA_x$ periodically refresh the potentials of the respective bit lines $BL_1$ to $BL_k$ during the programming period while a write control signal PROG is maintained at the first level, so that the bit lines $BL_1$—$BL_n$ are maintained at potentials corresponding to the programming level during each programming period. In this way, the programming for the row is executed corresponding to the data signal for the memory cell transistors connected to a selected word line (e.g., $WL_1$).

Thereafter, in response to a change in the level of the write control signal PROG from the first level to a second level, the generation of clock pulses in the internal clock signal ICK and hence the internal address signal ADI are stopped. As a consequence, all the levels of the column selection signals $Y_1$—$Y_k$ from the column decoder 5a assume the selection level for a predetermined length of time, and all the levels at the outputs of the write control sections $WA_1$—$WA_x$ assume the ground potential. Accordingly, the levels of the bit lines $BL_1$—$BL_n$ are reset to the ground potential, whereby the programming operation for one row of the memory cell transistors is completed.

In the above-mentioned conventional non-volatile semiconductor memory, there is a problem in that the threshold voltage varies among the memory cell transistors after completion of the programming as described above so that reliable programming cannot be effected in the memory device.

SUMMARY OF THE INVENTION

In view of the foregoing, it is an object of the present invention to provide a non-volatile semiconductor memory device which is capable of decreasing variations in threshold voltage among memory cell transistors after completion of programming to thereby obtain a reliable programming operation.

In accordance with the present invention, there is provided a non-volatile semiconductor memory device comprising a semiconductor substrate, a memory cell array formed on the semiconductor substrate and including at least one block having a plurality of memory cell transistors arranged in a matrix, each of the memory cell transistors having a floating gate for storage of electric charge, a plurality of word lines disposed for each row of the plurality of memory cell transistors, a plurality of bit lines disposed for each column of the plurality of memory cell transistors and including a first through a last bit lines, a row selection section for selecting one of the word lines during a write operation mode, a column selection section for selecting the plurality of bit lines one by one in the block during the write operation mode, a timing control section for controlling the column selection section to select each of the plurality of bit lines for a first period, and a write control section for providing electric charge in accordance with a data signal for the first period to the floating gate of each specified one of the memory cell transistors corresponding to the word line and the bit lines selected by the row selection section and column selection section.

In a preferred embodiment of the present invention, the timing control section includes a timing signal generating section and a counter section. The timing signal generating section sets the level of a write control signal at a first level, and generates an internal clock signal in the write operation mode. The timing signal generating section stops the generation of the internal clock signal in accordance with a clock stop signal, and resets the level of the write control signal to a second level at a predetermined timing. The counter section counts the clock pulses of the internal clock signal to detect the final address indicated by the internal address signal, which is updated each time when the level of the write control signal is changed from the second level to the first level, to thereby generate a reset signal. The counter section further counts to detect that the address indicated by the internal address signal has been updated from the initial address to the final address during the time period while the reset signal is being present, to thereby generate the clock stop signal.

In the conventional non-volatile semiconductor memory device as described before, it is found that the length of time (T1a, T2a, ..., Tka in FIG. 2) for programming or charging during which the potential is held at the programing level is different among the bit lines (e.g, $BL_1$ to $BL_k$) in each of the blocks, although the difference itself is small as compared to the entire length of time for programming. The equality T1a>T2a>...>Tka among those programming periods for respective bit lines presents variations in threshold voltage of the memory transistors after the programming.

In view of the above, in the present invention, the length of time for programming can be made substantially equal among the bit lines in each block. That is, programmed transistors in each block are subjected to substantially the same programming period. Due to providing the same programming period for the memory cell transistors, it is possible to reduce variations in threshold voltage among the plurality of memory cell transistors in each block after completion of the programming thereof. Accordingly, a reliable programming can be effected in the non-volatile semiconductor memory device.

The above and other objects, features and advantages of the present invention will be more apparent from the following description.

DESCRIPTION OF THE PREFERRED EMBODIMENT

Figure 3:
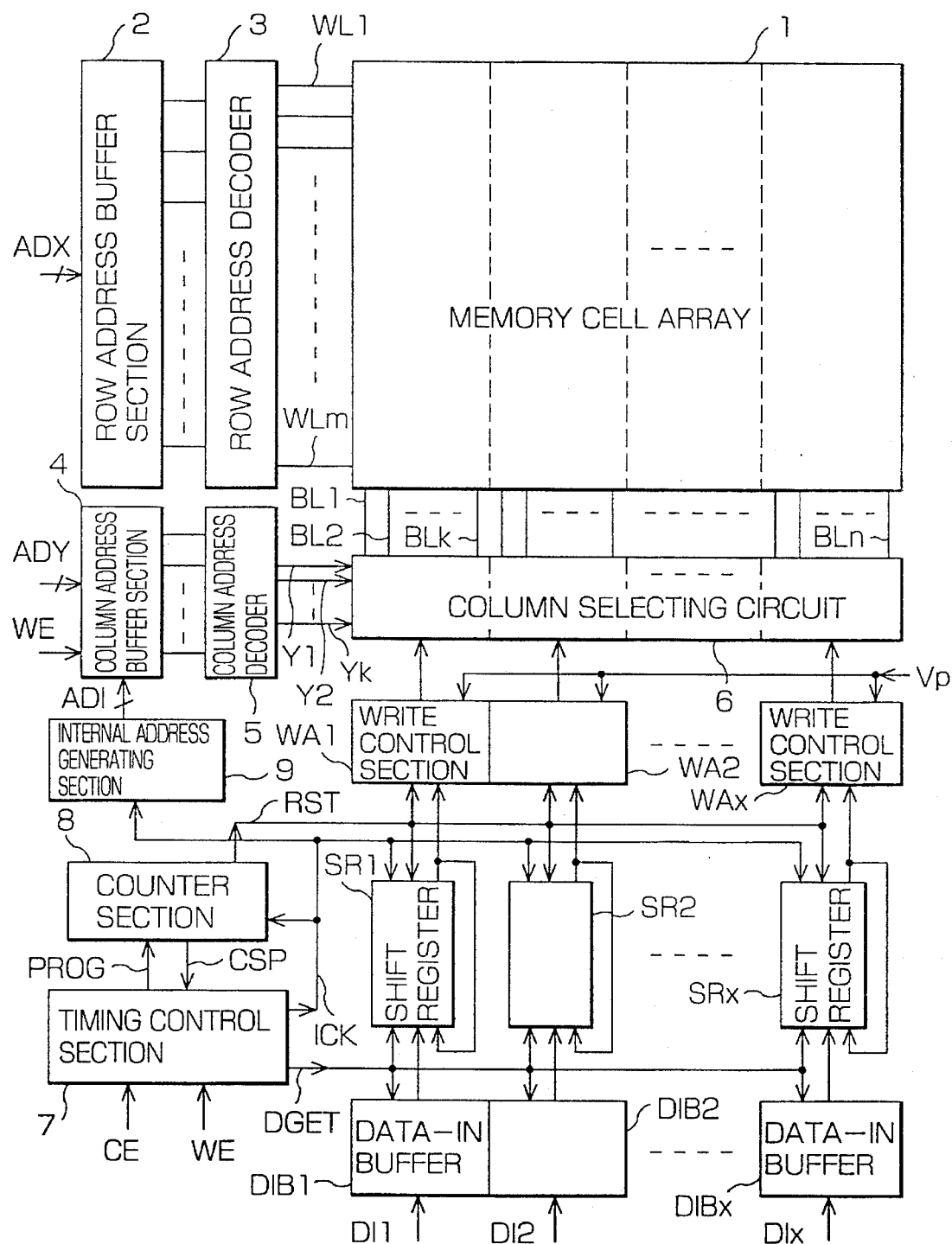
FIG. 3 is a block diagram of a non-volatile semiconductor memory device according to an embodiment of the present invention.

An embodiment of the present invention will now be described in detail with reference to the drawings. Referring to FIG. 3, there is shown a non-volatile semiconductor memory device according to the embodiment of the present invention.

The non-volatile semiconductor memory device has a semiconductor substrate not shown in the drawing, a memory cell array 1 formed on the semiconductor substrate and divided in a plurality: of (x) blocks each including a plurality of (k) columns of memory cell transistors, a plurality of (m) word lines $WL_1, WL_2, \ldots, WL_m$ extending in a row direction, a plurality of (n=k·x) bit lines $BL_1, BL_2, \ldots BL_n$ extending in a column direction and grouped in a plurality of (x) blocks corresponding to the blocks of the memory cell array 1 and each including k bit lines ($BL_1$ to $BL_k$ in the first block, for example), a row selection section (block) including a row address buffer section 2 and a row address decoder 3, a column selection section including a column address buffer section 4, a column address decoder 5 and a column selecting circuit 6, an internal address generating section 9, a plurality of (x) write control sections $WA_1, WA_2, \ldots, WA_x$, a plurality of (x) data signal input sections each including a shift register $SR_1, SR_2, \ldots,$ or $SR_x$ of a k-bit configuration and a data-in buffer $DI_1, DI_2, \ldots,$ or $DI_x$, and a timing control section including a timing signal generating section 7 and a counter section 8.

Each of the memory cell transistors of the memory cell array 1 has a floating gate for storing data therein for implementing a non-volatile memory storage function. One of the word lines $WL_1$ to $WL_m$ is selected by a first level applied from the row decoder 3 for decoding a row address signal $Ad_x$ supplied through the row address buffer section 2, thereby selecting one of the columns of the memory cell transistors. The column selecting circuit 6 of the column selection section has a plurality of (x) blocks each controlled by a corresponding output of the column address decoder 5 receiving an internal address signal ADI generated by the internal address generating section 9 through the row address buffer section 4, to thereby select k bit lines one by one in each block. Each of the write control sections $WA_1$ to $WA_x$ receives in a sequence of k data signals through a corresponding one of data-in buffers $DIB_1$ to $DIB_x$ and a corresponding one of shift registers $SR_1$ to $SR_x$, so as to program a corresponding column of the memory cell transistors by feeding the data signal $DI_1$ to $DI_x$ to a corresponding block of the column selecting circuit 6.

In the present embodiment, instead of the column decoder 5a in the conventional memory device, a column decoder 5 is provided which successively sets the levels of the k column selection signals $Y_1$—$Y_k$ at a selection level in accordance with the internal address signal ADI supplied from the column address buffer section 4. The column decoder 5 does not simultaneously set all the column selection signals $Y_1$—$Y_k$ at the selection level. Also, instead of the timing control section 7a in the conventional memory device, a timing signal generating section 7 and a counter section 8 are provided.

The timing signal generating section 7 of the timing control section generates a data fetch signal DGET at a predetermined timing, and sets the level of the write control signal PROG at a first level. The timing signal generating section 7 also generates an internal clock signal ICK at a certain timing. After a predetermined length of time has elapsed for the programming, the timing signal generating section 7 changes the level of the write control signal PROG from a first level to a second level, and stops the generation of the internal clock signal ICK in response to the generation of a clock stop signal CSP.

The counter section 8 counts the clock pulses of the internal clock signal ICK to detect the final address represented by the internal address signal ADI, which is updated each time when the level of the write control signal PROG is changed from a first level to a second level, to thereby generate a reset signal RST. Further, the counter section 8 detects that the address indicated by the internal address signal ADI has been updated from the initial address to the final address. The initial address and the final address correspond to the first bit line $BL_1$ and last bit line $BL_k$, respectively. When the counter section 8 detects the final address of the internal address signal ADI during the time period while the reset signal RST is present, the counter section 8 generates the clock stop signal CSP.

Figure 1:
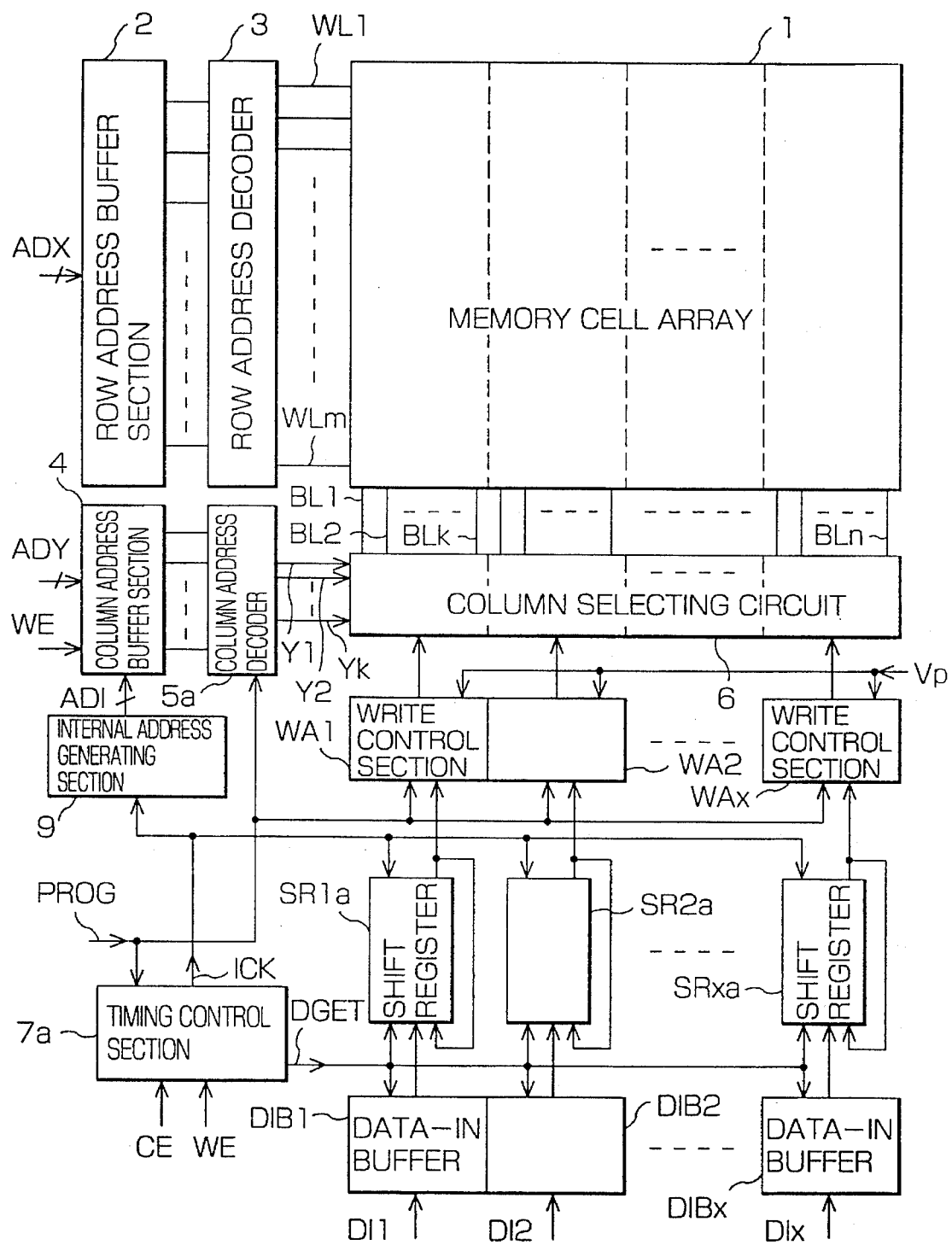
FIG. 1 is a block diagram of a conventional non-volatile semiconductor memory device.
Figure 2:
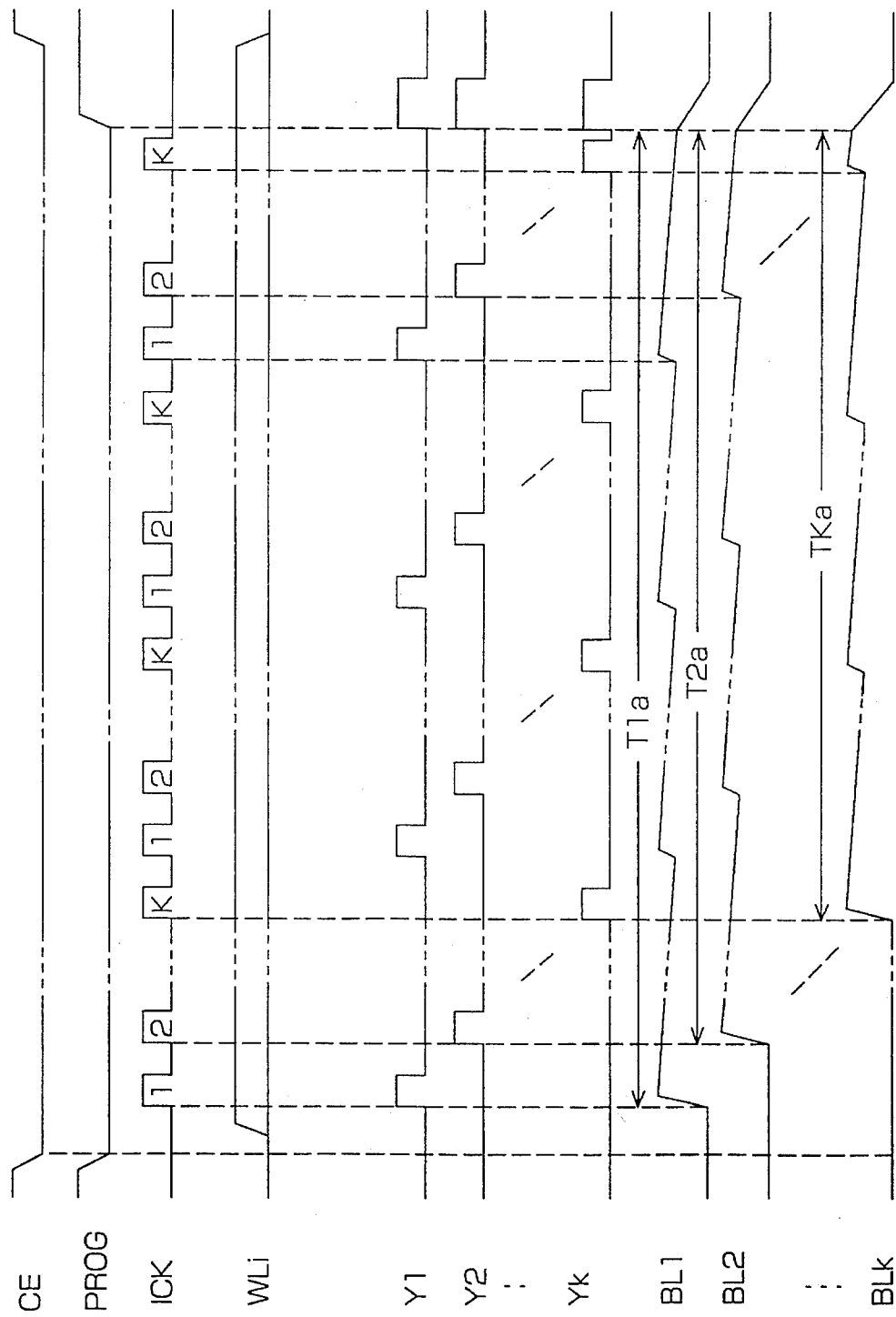
FIG. 2 is a timing chart showing waveforms of signals in the non-volatile semiconductor memory device of FIG. 1.
Figure 4:
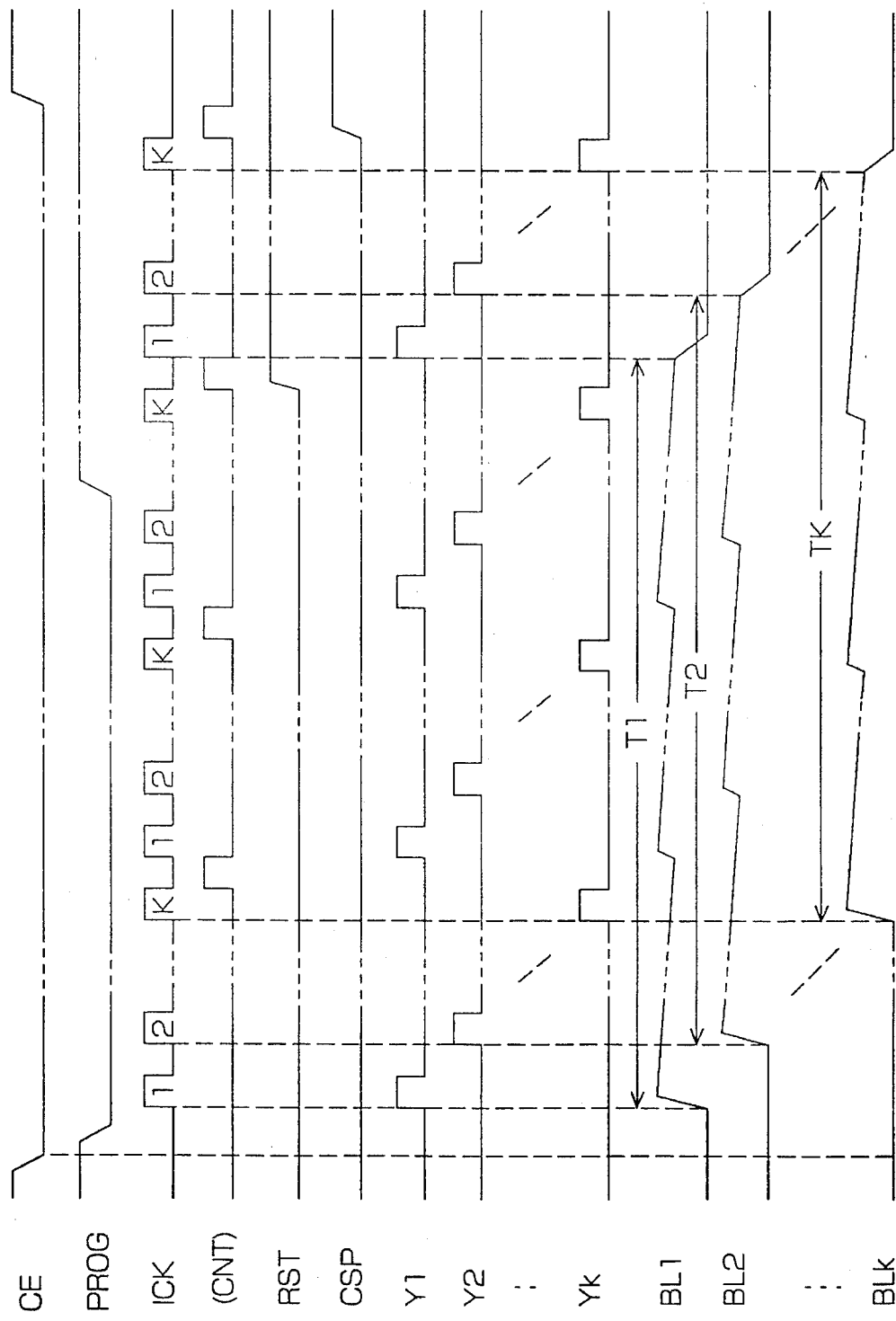
FIG. 4 is a timing chart showing waveforms of signals in the non-volatile semiconductor memory device of FIG. 3.

FIG. 4 shows, similarly to FIG. 2, a timing chart in a write mode operation of the present embodiment. Both the operation of receiving data signals $DI_1$ to $DI_x$ and the operation of transmitting the data signals to the corresponding bit lines after the write control signal PROG has been set at a first level (a low level) are similar to those of the conventional memory device of FIGS. 1 and 2. Accordingly, detailed description thereof will be omitted here.

When a predetermined length of time for programming has elapsed, the timing signal generating section 7 changes the level of the write control signal PROG from the first level to a second level (a high level). The level of the write control signal PROG itself may be supplied from outside the memory device, as in the case of FIG. 1.

The counter section 8 starts to count the internal clock signal ICK after the level of the write control signal PROG is set at the first level to initiate a programming period. The counter section 8 generates a count-up signal CNT during the programming period, without outputting the same to outside the counter section 8, each time when the address indicated by the internal address signal ADI is returned from the final address to the start address after a number (k), which is the same as the number of bit lines in each block, is counted. After the level of the write control signal PROG is changed from the first level to the second level to notice the end of the programming period, the counter section 8 generates a count-up signal CNT as a reset signal RST and further counts in response to the internal clock signal ICK. The reset signal RST is output after the address indicated by the internal address signal ADI returns from the final address to the first address.

The reset signal RST is input to both the write control sections $WA_1$—$WA_x$ and time shift registers $SR_1$—$SR_x$, whereby the potentials at the output of the write control sections $WA_1$—$WA_x$ are reset to the ground potential. Even while the reset signal RST is active, the internal clock signal ICK is supplied, whereby the address indicated by the internal address signal ADI is successively updated. As a result, the bit lines successively specified in each of the blocks by the internal address signal ADI are successively selected to be reset to the ground potential.

The counter section 8 counts k clock pulses of the internal clock signal ICK from the first address to the last address since the time instant of generation of the reset signal RST, to thereby generate a clock stop signal CSP and transmits the same to the timing signal generating section 7. The timing signal generating section 7, after receiving the clock stop signal CSP, stops generation of the clock pulses of the internal clock signal ICK to thereby finish the programming operation for the row.

In the present embodiment, the lengths of time $(T_1$—$T_k)$ during which the respective bit lines (e.g., $BL_1$—$BL_k$) are held at the programming potential they can be made substantially equal to one another, as shown $T_1=T_2=\ldots=T_k$ in FIG. 4. Accordingly, it is possible to reduce the variations in threshold voltage among the memory cell transistors after completion of the programming.

In the above-mentioned embodiment, although the number (x) of blocks for the bit lines $BL_1$—$BL_n$ and the number k of bit lines in each block may be arbitrarily determined, those numbers are preferably set at a multiple of 2 from the viewpoint of the circuit configuration.

Since above embodiment is described only for example, the present invention is not limited to such embodiment and it will be obvious for those skilled in the art that various modifications or alterations can be easily made based on the above embodiment within the scope of the present invention.

What is claimed is:

1. A non-volatile semiconductor memory device comprising:

a semiconductor substrate;

a memory cell array formed on said semiconductor substrate and including at least one block having a plurality of memory cell transistors arranged in a matrix, each of said memory cell transistors having a floating gate for storage of electric charge;

a plurality of word lines disposed for each row of said plurality of memory cell transistors;

a plurality of bit lines disposed for each column of said plurality of memory cell transistors and including a first bit line and a last bit line;

a row selection section for selecting one of said word lines during a write operation mode;

a column selection section for selecting said plurality of bit lines one by one in said block during said write operation mode;

a timing control section for controlling said column selection section to select each of said plurality of bit lines for a first period; and a write control section for providing electric charge in accordance with a data signal for said first period to said floating gate of each specified one of said memory cell transistors corresponding to said word line and said bit lines selected by said row selection section and column selection section, wherein said timing control section includes a timing signal generating section for generating an internal address signal in response to a start signal for said write operation mode, said internal address signal specifying said plurality of bit lines in cyclic order, and a counter section starting to count pulses of said internal address signal in response to said start signal for generating a stop signal for said timing signal generating section.

2. A non-volatile semiconductor memory device as defined in claim 1 wherein said first period begins and ends in sequence for said first bit line through said last bit line.

3. A non-volatile semiconductor memory device as defined in claim 1 wherein said timing control section generates a reset signal after said internal address signal specifies from said first bit line through said last bit line after a predetermined length of time has elapsed since generation of said start signal, and generates said stop signal after said internal address signal further specifies said first bit line through said last bit line since generation of said reset signal.

* * * * *